United States Patent [19]  [11] 4,298,678
McKeever  [45] Nov. 3, 1981

[54] PHOTOSENSITIVE COMPOSITIONS AND ELEMENTS CONTAINING SUBSTITUTED HYDROXYLAMINE

[75] Inventor: Mark R. McKeever, Sayre, Pa.

[73] Assignee: E. I. Du Pont de Nemours and Company, Wilmington, Del.

[21] Appl. No.: 178,089

[22] Filed: Aug. 14, 1980

[51] Int. Cl.³ .......................... G03C 1/52; G03C 1/68
[52] U.S. Cl. .................................... 430/281; 430/286; 430/288; 430/292; 430/338; 430/340; 430/343; 430/344
[58] Field of Search ............... 430/338, 340, 343, 344, 430/292, 281, 286, 341, 342

[56] References Cited

U.S. PATENT DOCUMENTS

| | | | |
|---|---|---|---|
| 2,965,685 | 12/1960 | Campbell | 260/666.5 |
| 3,148,225 | 9/1964 | Albert | 260/469 |
| 3,222,334 | 12/1965 | Demme | 260/84.7 |
| 3,390,996 | 7/1968 | MacLachlan | 430/334 |
| 3,479,185 | 11/1969 | Chambers | 430/278 |
| 3,552,986 | 1/1971 | Bassemir et al. | 117/12 |
| 3,558,387 | 1/1971 | Bassemir et al. | 156/99 |
| 4,066,459 | 1/1978 | Bachman et al. | 430/344 |

FOREIGN PATENT DOCUMENTS 55-335  4/1980  Japan ................................ 430/281

*Primary Examiner*—Won H. Louie, Jr.

[57] ABSTRACT

A photosensitive composition comprising a photooxidant, leuco dye and a substituted hydroxylamine compound of the formula $R_1R_2NOH$ wherein $R_1$ and $R_2$, e.g., are alkyl, cyclic alkyl, aryl, aralkyl, alkaryl and $R_1$ and $R_2$ taken together form a heterocyclic ring of 5 to 7 carbon atoms. Optionally monomers and polymeric binders can be present. The compositions are useful for photoimaging and in solvent and aqueous developable resist-forming films.

16 Claims, No Drawings

PHOTOSENSITIVE COMPOSITIONS AND ELEMENTS CONTAINING SUBSTITUTED HYDROXYLAMINE

TECHNICAL FIELD

This invention relates to photosensitive compositions. More particularly, it relates to photosensitive compositions containing selective substituted hydroxylamine compounds.

BACKGROUND ART

Photosensitive compositions are known which are useful in many ways. These compositions in dry film form are particularly effective in the formation of photoresists for the preparation of printed circuits, and in photoimaging systems such as those containing photoxidizable leuco dyes. A basic problem with almost all types of photosensitive compositions is that when they are subjected to elevated temperatures they become thermally unstable within a short time period. In addition, many of the reactions known to be included within the term "thermal instability" proceed as well at room temperature, albeit more slowly than at elevated temperatures, and thus contribute to a shortened shelf life. To improve thermal stability numerous types of thermal inhibitors have been added to photosensitive compositions. While many of the thermal inhibitors have been adequate, care must be used in selecting inhibitors because the inhibitors may detrimentally affect other properties of the particular compositions in which they may be present. The properties which should not be affected include photosensitivity and printout image stability. Inhibitors such as hydroquinone, p-methoxyphenol, p-quinone, etc., although they are effective in preventing polymerization of ethylenically unsaturated monomers when present in photosensitive materials, they do not stabilize the printout image and may impair the photosensitivity of the materials.

It is desirable that photosensitive formulations be prepared containing compounds that provide thermal stabilization of the printout image without detrimentally affecting photosensitivity as well as other properties.

DISCLOSURE OF THE INVENTION

In accordance with this invention there is provided a photosensitive composition comprising an admixture of
(A) a photooxidant compound,
(B) a leuco dye that is oxidizable to dye by the photooxidant, and
(C) a hydroxylamine compound of the formula $R_1R_2NOH$, and acid salts thereof, wherein each of $R_1$ and $R_2$ can be hydrogen with the proviso that both cannot be hydrogen, a linear or branched-chain alkyl group of 2 to 14 carbon atoms, a cyclic alkyl group of 5 to 14 carbon atoms, an aryl group of 6 to 10 carbon atoms, an aralkyl group wherein the aryl moiety is of 6 to 10 carbon atoms and the alkyl moiety is of 1 to 14 carbon atoms, and an alkaryl group wherein the aryl moiety is of 6 to 10 carbon atoms and the alkyl moiety is of 1 to 9 carbon atoms, and $R_1$ and $R_2$ when taken together may with the nitrogen atom form a heterocyclic ring.

A photosensitive element comprises a support bearing a layer of said photosensitive composition.

The photosensitive compositions of the invention in photoimaging form comprise a photooxidant compound, a leuco dye oxidizable by the photooxidant and a substituted hydroxylamine compound as defined above. In the event that the composition is photopolymerizable, at least one compound having ethylenic unsaturation is present. In both the photoimaging and photopolymerizable embodiments, at least one polymeric binder can be present. The photoimaging composition containing 2,4,5-triphenyl imidazolyl dimer as the photooxidant, leuco dye and hydroxylamine is stabilized to prevent color build-up in the nonimage areas. The following processes have been found to be effective to achieve such stabilization: treatment with solution containing a free radical trap, e.g., hydroquinone, phenidone, etc.; inclusion in the coating of precursors of hydroquinone which lead to its generation by heat, e.g., dihydropyran adduct of ditertiarybutylhydroquinone; inclusion of quinones (photoactivatible oxidants) and hydrogen donor compounds (reductant components) which may be employed to generate hydroquinones by light exposure, preferably at a wavelength distinct from the colorforming exposure; and photopolymerizable compounds which act as plasticizers to promote color formation until polymerized when they limit diffusion of color forming species and prevent formation of image color. Suitable inert solvents are generally present in preparing the formulations and plasticizers are commonly used therein. Additional components which can be present include: anti-blocking agents, dyes, and white and colored pigments which do not act as sensitizers, etc.

In the photopolymerizable composition containing the photooxidant, leuco dye, hydroxylamine and addition polymerizable ethylenically unsaturated compound there can be present a free radical producing, electron donor agent hydrogen donor (hydrogen donor), e.g., organic amines, mercaptans, certain halogen-containing compounds, active methylene compounds etc. Optional components that can be present in the photopolymerizable composition are: inert solvents, plasticizers, chain transfer agents, energy transfer dyes, oxygen scavengers, ultraviolet absorbers, etc.

The photooxidant compound which comprises one component of the photosensitive composition of the present invention can be divided into many classes such as are described in U.S. Pat. No. 3,390,996, column 8, line 31 to column 10, line 16, which is incorporated by reference. Photooxidants which function by the initiator mechanism include biimidazoles and the tetraarylhydrazines. Other photooxidants function by the acceptor type of mechanism such as tetraacylhydrazines, diacylaminobenzotriazoles, benzothiazole disulfides, triacylhydroxylamines, diacylaminotriazoles, alkylidene-2,5-cyclohexadiene-1-ones, polymethacrylaldehyde, diacylaminopyrazoles, and bibenzotriazoles. Halogen compounds are also useful photooxidants, e.g., bromoform and carbon tetrabromide, etc. The photooxidant is present in 0.1 to 7.0 percent by weight of solids in the photosensitive compositions.

The leuco form of the dye which comprises one component of a photosensitive composition of the present invention is the reduced form of the dye having one or two hydrogen atoms, the removal of which together with an additional electron in certain cases produces the dye. Such dyes have been described, for example, in U.S. Pat. No. 3,445,234, column 2, line 49 to column 8, line 55, incorporated by reference. The following classes are included:

(a) aminotriarylmethanes
(b) aminoxanthenes
(c) aminothioxanthenes
(d) amino-9,10-dihydroacridines
(e) aminophenoxazines
(f) aminophenothiazines
(g) aminodihydrophenazines
(h) aminodiphenylmethanes
(i) leuco indamines
(j) aminohydrocinnamic acids (cyanoethanes, leuco methines)
(k) hydrazines
(l) leuco indigoid dyes
(m) amino-2,3-dihydroanthraquinones
(n) tetrahalo-p,p'-biphenols
(o) 2(p-hydroxyphenyl)-4,5-diphenylimidazoles
(p) phenethylanilines.

Of these leuco forms, (a) through (i) form the dye by losing one hydrogen atom, while the leuco forms (j) through (p) lose two hydrogen atoms to produce the parent dye. Aminotriarylmethanes are preferred. A general preferred aminotriarylmethane class is that of the acid salts of aminotriarylmethanes wherein at least two of the aryl groups are phenyl groups having (a) an $R_1R_2N$-substituent in the position para to the bond to the methane carbon atom wherein $R_1$ and $R_2$ are each groups selected from hydrogen, $C_1$ to $C_{10}$ alkyl, 2-hydroxyethyl, 2-cyano-ethyl, or benzyl and (b) a group ortho to the methane carbon atom which is selected from lower alkyl (C is 1 to 4), lower alkoxy (C is 1 to 4), fluorine, chlorine or bromine; and the third aryl group may be the same as or different from the first two, and when different is selected from (a) Phenyl which can be substituted with lower alkyl, lower alkoxy, chloro, diphenylamino, cyano, nitro, hydroxy, fluoro or bromo;
(b) Naphthyl which can be substituted with amino, di-lower alkylamino, alkylamino;
(c) Pyridyl which can be substituted with alkyl;
(d) Quinolyl;
(e) Indolinylidene which can be substituted with alkyl.

Preferably, $R_1$ and $R_2$ are hydrogen or alkyl of 1-4 carbon atoms. Leuco dye is present in 0.1 to 5.0 percent by weight of solids in the photosensitive composition.

With the leuco form of dyes which have amino or substituted amino groups within the dye structure and which are characterized as cationic dyes, an amine salt-forming mineral acid, organic acid, or an acid from a compound supplying acid is employed. The amount of acid usually varies from 0.33 mol to 1 mol per mol of amino nitrogen in the dye. The preferred quantity of acid is about 0.5 to 0.9 mol per mol of amino nitrogen. Representative acids which form the required amine salts are hydrochloric, hydrobromic, sulfuric, phosphoric, acetic, oxalic, p-toluenesulfonic, trichloroacetic, trifluoroacetic and perfluoroheptanoic acid. Other acids such as acids in the "Lewis" sense or acid sources which may be employed in the presence of water or moisture include zinc chloride, zinc bromide, and ferric chloride. Representative leuco dye salts include tris-(4-diethylamino-o-tolyl) methane zinc chloride, tris-(4-diethylamino-o-tolyl) methane oxalate, tris-(4-diethylamino-o-tolyl) methane p-toluene-sulfonate and the like.

Hydroxylamines of the types described above are present in the photosensitive compositions to provide thermal stabilization as well as printout image stability. Surprisingly, the hydroxylamines do not detrimentally affect the photosensitivity and other properties of the elements in which the photosensitive compositions are present. The hydroxylamines containing two alkyl groups may be prepared by any one of several known methods, e.g., by converting the appropriate tertiary amine to the amine oxide and pyrolyzing the oxide to hydroxylamine and olefin as disclosed by Cope et al. in J. Am. Chem. Co., 79, 964 (1957). The preparation of several hydroxylamines is described below. Useful hydroxylamine compounds include but are not limited to: N,N-diethyl- to N,N-ditetradecylhydroxylamine; N,N-cyclopentyl- to N,N-cyclotetradecylhydroxylamine; N,N-diphenyl- and N,N-dinaphthylhydroxylamine; N,N-dibenzyl-, N,N-diphenylethylhydroxylamine; N,N-di-p-tolyl-, N,N-di-p-nonylphenylhydroxylamine; N,N-di(4-methyl-1-naphthyl)hydroxylamine, N,N-di(4-methyl-2-naphthyl)hydroxylamine; N-hydroxylpyrrolidine, N-hydroxypiperidine, N-hydroxyhexahydroazepine; 2,3-bis(hydroxyamino)-2,3-dimethylbutane, other analogs containing more than one hydroxylamino group per molecule; and other compounds exemplified below, etc. The hydroxylamines are present in 0.05 to 5.0 percent by weight of solids in the photosensitive compositions. A preferred range is about 0.05 to about 0.5 percent by weight of solids in the photosensitive composition.

In the photoimaging embodiment of this invention wherein a photopolymerizable monomeric compound is not present redox couples can be present such as are described in U.S. Pat. No. 3,658,543. column 9, lines 1 to 46, incorporated by reference. Preferred oxidants include 9,10-phenanthrenequinone alone or in admixture with 1,6- and 1,8-pyrenequinone which absorb principally in the 430 to 550 nm region. The reductant component of the redox couple is 100 to 10 percent of an acyl ester of triethanolamine of the formula:

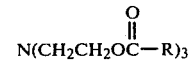

where R is alkyl of 1 to 4 carbon atoms, and 0 to 90 percent of a $C_1$ to $C_4$ alkyl ester of nitrilotriacetic acid or of 3,3',3"-nitrilotripropionic acid. Triethanolamine triacetate and dibenzylethanolamine acetate are preferred reductant components. The molar ratios of oxidants to biimidazole used range from 0.01:1 to 2:1, preferably 0.2:1 to 0.6:1. The molar ratios of reductant to biimidazole used range from about 1:1 to about 90:1, preferably 10:1 to 20:1.

Optionally, other additives can be present in the photoimaging composition. Polymeric binders can be added to thicken the formulations or adhere them to substrates. The binders can also serve as a matrix for the color-forming composition. Light-transparent and film-forming polymers are preferred. Examples are ethyl cellulose, polyvinyl alcohol, polyvinyl chloride, polystyrene, polyvinyl acetate, poly-(methyl, propyl or butyl methacrylate), cellulose acetate, cellulose butyrate, cellulose acetate butyrate, cellulose nitrate, chlorinated rubber, copolymers of the above vinyl monomers, etc. The binder can be present in an amount from about 0.5 part to about 200 parts by weight per part of combined weight of the hexaphenylbiimidazole and leuco dye. Generally 5 to 20 parts by weight are used.

The binder composition can also contain inert infusible fillers such as titanium dioxide, organophilic colloidal silica, bentonite, powdered glass, micron-sized alumina and mica in minor, noninterferring amounts. Formulations containing micron-sized silicas, as, for example, the "Syloid" silica gels, sold by W. R. Grace & Co., are particularly useful for providing a "tooth" for pencil or ink receptivity and eliminating blocking tendencies.

With some polymers, it is desirable to add a plasticizer, e.g., solid or liquid, to give flexibility to the film or coating. Suitable plasticizers are disclosed in U.S. Pat. No. 3,658,543, column 10, lines 20 to 73, incorporated by reference. A preferred liquid plasticizer is Nonylphenoxypoly(ethyleneoxy)-ethanol. A preferred solid plasticizer is N-ethyl-p-toluenesulfonamide. The plasticizers can be used in concentration ranging from 1:20 to 5:3, preferably 1:5 to 1:2, based on the weight of polymeric binder used.

In preparing the formulation generally inert solvents are employed which are volatile at ordinary pressures. Examples include alcohols and ether alcohols such as methanol, ethanol, 1-propanol, 2-propanol, butanol, and ethylene glycol; esters such as methyl acetate and ethyl acetate; aromatics such as benzene, o-dichlorobenzene and toluene; ketones such as acetone, methyl ethyl ketone and 3-pentanone; aliphatic halocarbons such as methylene chloride, chloroform, 1,1,2,-trichloroethane, 1,1,2,2-tetrachloroethane and 1,1,2-trichloroethylene; miscellaneous solvents such as dimethylsulfoxide, pyridine, tetrahydrofuran, dioxane, dicyanocyclobutane and 1-methyl-2-oxo-hexamethyleneimine; and mixtures of these solvents in various proportions as may be required to attain solutions. It is often beneficial to leave a small residue of solvent in the dried composition so that the desired degree of imaging can be obtained upon subsequent irradiation.

Useful optional antiblocking agents present to prevent the coatings from adhering to one another include

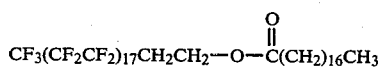

and other known agents.

The photopolymerizable composition embodiment of this invention, in addition to the photooxidant, leuco dye, hydroxylamine and optional binder contains at least one addition polymerizable ethylenically unsaturated compound having at least one polymerizable ethylenic group present. Such compounds are capable of forming a high polymer by free-radical initiated, chain-propagating, addition polymerization. Preferably, the monomeric compound has at least two terminal ethylenically unsaturated groups, e.g., 2 to 4 groups. The monomeric compounds are nongaseous, i.e., at 20° C. and atmospheric pressure, have a normal boiling point about 100° C. and a plasticizing action on any thermoplastic polymeric binder that may be present.

Ethylenically unsaturated monomeric compounds useful in this invention include monomeric compounds or polymers wherein the ethylenic unsaturation is present as an extralinear substituent attached to the polymer backbone. Useful monomeric compounds are: alkylene or a polyalkylene glycol diacrylate prepared from an alkylene glycol of 2 to 15 carbons or a polyalkylene ether glycol of 1 to 10 ether linkages; unsaturated esters of alcohols, preferably polyols and particularly such esters of the alphamethylene carboxylic acids, e.g., ethylene glycol diacrylate, diethylene glycol diacrylate, glycerol diacrylate, glycerol triacrylate, ethylene glycol dimethacrylate, triethyleneglycol dimethacrylate, 1,3-propanediol dimethacrylate, 1,2,4-butanetriol trimethacrylate, 1,4-cyclohexanediol diacrylate, 1,4-benzenediol dimethacrylate, trimethylol propane triacrylate, pentaerythritol tetramethacrylate, 1,3-propanediol diacrylate, 1,5-pentanediol dimethacrylate, pentaerythritol triacrylate; the bis-acrylates and methacrylates of polyethylene glycols of molecular weight 200–500, etc.; unsaturated amides, particularly those of the alpha-methylene carboxylic acids, and especially those of alpha-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis(gamma-methacrylamidopropoxy) ethane, beta methacrylamidoethyl methacrylate, N-(betahydroxyethyl)-beta-(methacrylamido) ethyl acrylate and N,N-bis (beta-methacryloxyethyl) acrylamide; vinyl esters such as divinyl succinate, divinyl adipate, divinyl phthalate, divinyl terephthalate; divinyl benzene-1,4-disulfonate, and divinyl butane-1,4-disulfonate, styrene and derivatives thereof and unsaturated aldehyde, such as sorbaldehyde (hexadienal).

Useful polymers having ethylenically unsaturated groups attached thereto are: the polymerizable, ethylenically unsaturated polymers of U.S. Pat. No. 3,043,805 and U.S. Pat. No. 2,929,710, e.g., polyvinyl acetate/acrylate, cellulose acetate/acrylate, cellulose acetate/methacrylate, N-acrylyloxymethyl polyamide, etc.; polyoxyethylated trimethylol propane triacrylate, polytetramethylene glycol diacrylate, etc., disclosed in U.S. Pat. No. 3,418,295.

Free radical producing, electron donor agents (hydrogen donor) and active methylene compounds that can be present in the photopolymerizable photoimaging composition are described in U.S. Pat. No. 3,479,185, column 2, line 50 to column 3, line 3, incorporated by reference. The electron donor agent has a reactive atom, usually hydrogen, which is removable and in the presence of the radical such as that of the substituted 2,4,5-triphenylimidazolyl dimer yields a radical which reacts with the monomeric compound to initiate growth of polymer chains.

Examples of preferred electron or hydrogen donor compounds include compounds that form a stable composition with the hexaphenylbiimidazole compound in the dark. The agent can be an amine, e.g., a tertiary amine. The amine-substituted leuco dyes are useful, especially those having at least one dialkylamino group. Also, any leuco triphenylamine dye or various salts of the dye, e.g., the HCl salt of the leuco blue dye can be used. Illustrations of suitable dyes include tris-(4-N,N-diethylamino-o-tolyl)-methane trihydrochloride, bis(4-N,N-diethylamino-o-tolyl)triphenylmethane, bis(4-N,N-diethylamino-o-tolyl) methylenedioxyphenylmethane, leuco neutral shade dye, i.e., bis(4-N,N-diethylamino-o-tolyl)-benzyl thiophenylmethane, Leuco Malachite Green (C.I. Basic Green 4), leuco forms of Crystal Violet, Brilliant Green (C.I. Basic Green 1), Victoria Green 3B (C.I. Basic Green 4), Acid Green GG (C.I. Acid Green 3), Methyl Violet (C.I. Basic Violet 1), Rosaniline (C.I. Basic Violet 14), etc. The salt forms, e.g., HCl salt, salts with Lewis acid, sulfuric acid salts, p-toluene sulfonic acid salts, etc., of the leuco dye are preferred for use.

Additional suitable, electron donor agents which can be used singly or in combination include aniline, N- methylaniline, N,N-diethylaniline, N,N-diethylcresidine, triethanolamine, ascorbic acid, 2-allylthiourea, sarcosin, N,N-diethylglycine, trihexylamine, diethylcyclohexylamine, N,N,N',N'-tetramethylethylenediamine, diethylaminoethanol, ethylaminoethanol, N,N,N',N'-ethylenediaminotetracetic acid, N-methylpyrrolidone, N,N,N',N'',N''-pentamethyldiethylenetriamine, N,N-diethylxylidene, N,N'-dimethyl-1,4-piperazine, N-β-hydroxyethylpiperidine, N-ethylmorpholine, and related amino compounds. While the tertiary amines and especially the aromatic tertiary amines having at least one CH$_2$ group adjacent to the nitrogen atoms are preferred, a combination of two radical generating agents such as a tertiary amine, e.g., N,N-dimethylaniline, and a secondary amine, e.g., N-phenylglycine, appear especially useful.

In a photosensitive composition containing the hexaphenylbiimidazole, monomeric compound and electron donor agent, the light-sensitivity, speed, or degree of polymerization is dependent on the concentration of the hexaphenylbiimidazole and electron donor agent. Useful compositions may be limited in part by the solubilities of the components. The speed generally increases up to a certain concentration of hexaphenylbiimidazole and electron donor agent, and an increase of the concentration above that level may not produce any increase in speed and in some instances the speed may decrease. When a leuco dye is used as the electron donor agent, a mole ratio of leuco dye to the hexaphenylbiimidazole of 1.0 to 1.4 gives the best results as to photospeed and stability.

As indicated above, optionally, but preferably, at least one polymeric binder can be present in the photopolymerizable composition. Suitable binders include: the polymerized methylmethacrylate resins including copolymers thereof with, for example acrylic acid, polyvinyl acetals such as polyvinyl butyral and polyvinyl formal, vinylidene chloride copolymers (e.g., vinylidene chloride/acrylonitrile, vinylidene chloride/methacrylate and vinylidene chloride/vinylacetate copolymers), synthetic rubbers (e.g, butadiene/acrylonitrile copolymers and chloro-2-butadine-1,3 polymers), cellulose esters (e.g, cellulose acetate, cellulose acetate succinate and cellulose acetate butyrate), polyvinyl esters (e.g, polyvinyl acetate/acrylate, polyvinyl acetate/methacrylate and polyvinyl acetate), polyvinyl chloride and copolymers (e.g, polyvinyl chloride/acetate), polyurethanes, polystyrene and the polymeric binders described in U.S. Pat. No. 3,418,295. Styrene/maleic acid copolymers and other such binders which provide aqueous solubility are also useful. Styrene/acrylic acid binders are useful with the styrene/maleic acid copolymers. The monomeric compounds and polymeric binder are present in the photopolymerizable composition in from 3 to 97 to 97 to 3 parts by weight, respectively.

The plasticizers, when used, are generally present in amounts of 10 to 50 percent by weight based on the weight of monomeric compound. Oxygen scavengers, e.g., 2-allyl thiourea, dimethylsulfoxide, stannous chloride, N-phenylglycine, etc., can be present. The oxygen scavenger appears to eliminate or reduce the induction period usually found in a photopolymerizable reaction, possibly by consumption of oxygen in the layer prior to to exposure.

Suitable chain transfer agents, in an amount of from 0.01 to 0.1 mol/mol electron donor agent such as a leuco dye, e.g., N-phenylglycine, 1,1-dimethyl-3,5-diketocyclohexane, or organic thiols, e.g., 2-mercaptobenzothiazole, 2-mercaptobenzoxazole, 2-mercaptobenzimidazole, pentaerythritol tetrakis (mercaptoacetate), 4-acetamidothiophenol, mercaptosuccinic acid, dodecanethiol, beta-mercaptoethanol, or other organic thiols are useful.

Energy transfer dyes are disclosed in U.S. Pat. No. 3,479,185, column 5, lines 57 to 74, incorporated by reference. Generally such dyes are present in 0.5 to 3.0% by weight based on the weight of monomer or binder component, if the latter is present.

For imaging uses, the compositions of this invention may be coated upon or impregnated in substrates following known techniques. Substrates include materials commonly used in the graphic arts and in decorative applications such as paper ranging from tissue paper to heavy cardboard, films of plastics and polymeric materials such as regenerated cellulose, cellulose acetate, cellulose nitrate, polyethylene terephthalate, vinyl polymers and copolymers, polyethylene, polyvinyl acetate, polymethyl methacrylate, polyvinylchloride; textile fabrics; glass, wood and metals. The composition, usually as a solution in a carrier solvent described above, may be sprayed, brushed, applied by a roller or an immersion coater, flowed over the surface, picked up by immersion or spread by other means, and the solvent evaporated.

Any convenient source providing radiation of wavelengths in the range of 200 nm to 420 nm can be used to activate the photoimaging composition for triphenylimidazolyl radical formation, image formation, and photopolymerization initiation. The radiation may be natural or artificial, monochromatic or polychromatic, incoherent or coherent, and should be sufficiently intense to activate a substantial proportion of the photoinitiator.

Conventional light sources include fluorescent lamps, mercury, metal additive and arc lamps. Coherent light sources are the pulsed nitrogen-, xenon, argon ion- and ionized neon-lasers whose emissions fall within or overlap the ultraviolet or visible absorption bands of the photoinitiator. Ultraviolet and near-visible radiation-emitting cathode ray tubes widely useful in printout systems for writing on photosensitive materials are also useful with the subject compositions.

Images may be formed by writing with a beam of the activating light or by exposing to such light a selected area behind a negative, stencil, or other relatively opaque pattern. The negative may be silver on cellulose acetate or polyester film or one in which its opacity results from aggregations of areas having different refractive indices. Image formation may also be effected in conventional diazo printing apparatus, graphic arts exposure or electronic flash equipment and by projection as described in U.S. Pat. No. 3,661,461. The light exposure time may vary from a fraction of a second to several minutes, depending upon the intensity and spectral energy distribution of the light, its distance from the composition, the nature and amount of the composition available, and the intensity of color in the image desired.

BEST MODE FOR CARRYING OUT THE INVENTION

The best mode is illustrated in Example 1 wherein the hydroxylamine is N,N-diethylhydroxylamine.

INDUSTRIAL APPLICABILITY

The hydroxylamines are useful in improving thermal stability of photosensitive compositions and elements of the photoimaging type containing admixtures of photooxidants and leuco dyes and addition polymerizable compositions which contain photooxidants, leuco dyes and addition polymerizable ethylenically unsaturated monomeric compounds. The photoimaging products are of the dual response type wherein controlled sequential exposure with ultraviolet and visible light may yield negative or positive images, e.g., Dylux ® proofing papers, printout paper, e.g., for the Du Pont "aca" automatic clinical analyzer; garment pattern papers, overlay films, and heatfix type papers and films. The photopolymerizable compositions containing the hydroxylamines are useful in supported elements for dry photoresists, particularly aqueous developable photoresists, for printing uses as well as a variety of copying, e.g., office copying, recording and decorative.

EXAMPLES

The following examples illustrate the invention wherein the percentages are by weight.

Procedures

Several hydroxylamines illustrated in the examples below were synthesized according to the following procedures.

| N,N-dibutylhydroxylamine | |
|---|---|
| Into a round-bottom flask is placed: | |
| tributylamine | 50 g |
| $H_2O_2$ (30%) | 52 g |
| methanol | 50 ml |

The mixture is reacted for three days at room temperature and then the methanol and water are removed by distillation. A vacuum is drawn and any unreacted amine is distilled off. After heating the remaining material for one hour, a clear yellow oil remains (at normal room temperature). The oil solidifies to a solid in an ice bath and boils at about 90°14 100° C. under vacuum. An infrared spectrum reveals a peak at a wavelength of ~3.0 microns which signifies the formation of an N-OH compound.

| N,N-diodecylhydroxylamine | |
|---|---|
| Into a round-bottom flask is placed: | |
| tridodecylamine | 50 g |
| $H_2O_2$ (30%) | 40 g |
| ethanol | 50 ml |

The above procedure is repeated up to the vacuum drawing step. The solution is heated to 235° C. to remove any unreacted amine. The remaining material is pyrolyzed under vacuum at 250° C. for 0.5 hour. Upon cooling to room temperature a light brown solid forms. An infrared spectrum reveals the same peak as reported above signifying the formation of an N—OH compound.

| N,N-diphenylhydroxylamine | |
|---|---|
| diphenylamine | 16 g |
| $H_2O_2$ (30%) | 22 g |
| methanol | 150 ml |

The procedure followed for the preparation of N,N-dibutylhydroxylamine is repeated. After removing any unreacted amine a brown material solid at room temperature forms. An infrared spectrum reveals a peak at a wavelength of ~3.0 microns signifying the formation of an N—OH compound. The N,N-dinaphthyl hydroxylamine can be prepared in similar fashion.

In order to determine whether a particular hydroxylamine inhibits the oxidation of a leuco dye to its dye form, e.g., leuco crystal violet to crystal violet, a hydroxylamine in an amount ranging from 0.05 gram to 10 grams is added to the following solutions:

| Ingredient | Amount (g) |
|---|---|
| Methylene chloride | 200.0 |
| Methanol | 20.0 |
| Styrene/maleic anhydride, partially esterified with isopropanol, molecular weight 10,000 | 25.0 to 27.0 |
| Leuco crystal violet | 0.2 to 0.25 |

The absorbance of crystal violet at approximately 587 nm to 590 nm is monitored with time. The following results are obtained for the indicated compound wherein the % inhibition equals $$\frac{\Delta A(\text{Control}) - \Delta A(\text{Sample})}{\Delta A(\text{Control})}$$

ΔA is the increase in absorbance after X days.

| Hydroxylamine Compound (g) | Room Temp Aging (days) | ΔA (Control) | ΔA (Sample) | % Inhibition |
|---|---|---|---|---|
| N,N-diethyl- | | | | |
| 0.2 | 3 | 2.01 | 0.63 | 68.7 |
| 1.0 | 5 | >>3.0 | 0.525 | — |
| 5.0 | 3 | 2.01 | 0.30 | 85.1 |
| 10.0 | 3 | 2.01 | 0.20 | 90.0 |
| N,N-dibutyl- | | | | |
| 0.5 | 1 | 1.304 | 0.106 | 91.9 |
| N,N-didodecyl-phenyl- | | | | |
| 0.5 | 1 | 0.710 | 0.290 | 59.2 |
| N,N-dibenzyl- | | | | |
| 0.05 | 1 | 0.951 | 0.528 | 45.9 |
| 0.2 | 2 | 1.496 | 0.322 | 78.5 |
| 5.0 | 1 | 0.951 | 0.129 | 86.4 |
| N,N-diphenyl- | | | | |
| 0.75 | 3 | 3.75 | 3.36 | 10.4 |
| N-cyclohexyl- . HCl | | | | |
| 0.05 | 5 | >>3.0 | >3.0 | — |
| 0.25 | 5 | >>3.0 | 2.88 | — |
| 1.0 | 5 | >>3.0 | 2.607 | — |
| 5.0 | 5 | >>3.0 | 0.954 | — |
| N-hydroxypiperidine | | | | |
| 0.05 | 5 | >>3.0 | 0.483 | — |
| 0.25 | 5 | >>3.0 | 0.450 | — |
| 1.0 | 5 | >>3.0 | 0.417 | — |
| 5.0 | 5 | >>3.0 | 0.120 | — |
| 2,3-bis(hydroxylamino)-2,3-dimethylbutane- . $H_2SO_4$ | | | | |
| 0.20 | 2 | 1.917 | 0.999 | 47.9 |
| 2,3-bis(hydroxylamino)-2,3-dimethylbutane | | | | |

| Hydroxylamine Compound (g) | Room Temp Aging (days) | ΔA (Control) | ΔA (Sample) | % Inhibition |
|---|---|---|---|---|
| 0.20 | 2 | 1.917 | 1.227 | 36.0 |

In the following examples photosensitive compositions containing the ingredients set forth below are dissolved in a mixture containing 90% methylene chloride and 10% methanol at 30% solids. Samples are prepared to which are added the hydroxylamine compounds listed below. One sample is used as a control. Films are cast from an 0.008 inch (0.20 mm) coating knife onto 0.004 inch (0.10 mm) polyethylene terephthalate film giving a 0.0015 inch (0.038 mm) coating. The solvent is removed by air drying. Absorption spectra are obtained for the freshly cast film and the aged samples. The absorbance is measured at 603–605 nm for the Examples.

EXAMPLES 1 to 10

| Ingredient | Amount (g) |
|---|---|
| Styrene/maleic anhydride copolymer mol wt 20,000, Acid No. 180 | 35.5 |
| Paratoluene sulfonic acid | 0.10 |
| Trimethylolpropanetriacrylate | 28.0 |
| Triethyleneglycol dimethacrylate | 3.0 |
| Styrene/acrylic acid copolymer, mol wt 7,000, Acid No. 200 | 25.0 |
| Benzophenone | 5.0 |
| Michler's ketone | 0.5 |
| 2,2'-bis-(o-chlorophenyl)-4,4'5,5'-tetraphenylbiimidazole | 2.0 |
| Benzotriazole | 0.4 |
| Leuco crystal violet | 0.4 |
| Victoria green dye (C.I. Basic Green 4) | 0.03 |

| Hydroxylamine Compound (g) | Aging (days) at 40°C. | ΔA (Control) | ΔA (Sample) | % Inhibition |
|---|---|---|---|---|
| (1) N,N-diethyl- | | | | |
| 0.2 | 3 | 0.320 | 0.124 | 61.3 |
| 1.0 | 3 | 0.320 | 0.100 | 68.8 |
| 5.0 | 3 | 0.320 | 0.060 | 87.6 |
| (2) N,N-didodecyl- | | | | |
| 0.5 | 3 | 0.316 | 0.290 | 8.22 |
| (3) N,N-dibutyl- | | | | |
| 0.05 | 4 | 0.256 | 0.214 | 16.4 |
| 0.50 | 4 | 0.256 | 0.108 | 57.8 |
| (4) N,N-dibenzyl- | | | | |
| 0.05 | 1 | 0.510 | 0.140 | 72.5 |
| 0.50 | 1 | 0.510 | 0.030 | 94.1 |
| 5.0 | 1 | 0.510 | 0.016 | 96.9 |
| (5) N,N-diphenyl- | | | | |
| 0.50 | 3 | 0.316 | 0.080 | 74.7 |
| (6) N-tert-butyl- | | | | |
| 0.05 | 1 | 0.510 | 0.130 | 74.5 |
| 0.50 | 1 | 0.510 | 0.124 | 75.7 |
| (7) N-cyclohexyl- . HCl | | | | |
| 0.50 | 3 | 0.546 | 0.104 | 81.0 |
| (8) N-hydroxypryidine | | | | |
| 0.05 | 1 | 0.510 | 0.214 | 58.0 |
| 0.50 | 1 | 0.510 | 0.268 | 47.5 |
| 5.00 | 1 | 0.510 | 0.006 | 98.8 |
| (9) 2,3-bis(hydroxyamino)-2,3-dimethylbutane . H$_2$SO$_4$ | | | | |
| 0.25 | 4 | 0.256 | 0.180 | 29.7 |
| (10) 2,3-bis(hydroxyamino)-2,3-dimethylbutane | | | | |
| 0.25 | 4 | 0.256 | 0.148 | 42.2 |

Examples 11 and 12

| Ingredient | Amount (g) |
|---|---|
| 2,2'-bis(o-chlorophenyl)-4,4',5,5'-tetraphenylbiimidazole | 2.5 |
| Michler's ketone | 0.12 |
| Benzophenone | 4.0 |
| Benzotriazole | 0.20 |
| Victoria green dye (C.I. Basic Green 4) | 0.035 |
| p-Toluene sulfonic acid | 0.05 |
| Pigment prepared from 40% of Malachite green (C.I. Basic Green 4) and 60% of a copolymer of methylmethacrylate (45%)/acrylonitrile (10%)/butadiene (15%/styrene (30%), inherent viscosity 0.60 | 0.115 |
| Ethylacrylate (9%)/methylmethacrylate (91%) copolymer, inherent viscosity 0.43 | 24.5 |
| Polymethylmethacrylate, inherent viscosity 1.37 | 27.5 |
| Trimethylolpropanetriacrylate | 32.8 |
| Mixed ortho and para isomers of toluene sulfonamide | 8.0 |
| Tris-[4-diethylamino-2-tolyl]-methane | 0.15 |
| Leuco crystal violet | 0.10 |

| Hydroxylamine Compound (g) | Aging (days) at 60° C. | ΔA (Control) | ΔA (Sample) | % Inhibition |
|---|---|---|---|---|
| (11) N,N-diethyl- | | | | |
| 0.1 | 3 | 0.450 | 0.128 | 71.6 |
| 0.5 | 3 | 0.450 | 0.104 | 76.9 |
| (12) N-cyclohexyl- | | | | |
| 0.1 | 3 | 0.450 | 0.274 | 39.1 |

Examples 13 to 15

| Ingredient | Amount (g) |
|---|---|
| Styrene/maleic anhydride copolymer mol wt 20,000, Acid No. 180 | 35.5 |
| p-Toluene sulfonic acid | 0.1 |
| Tricresylphosphate | 31.0 |
| Styrene/acrylic acid copolymer, mol wt 7,000, Acid No. 200 | 25.0 |
| Benzophenone | 5.0 |
| Michler's ketone | 0.5 |
| 2,2'-bis(o-chlorophenyl)-4,4',5,5'-tetraphenylbiimidazole | 2.0 |
| Benzotriazole | 0.4 |
| Victoria green dye (C.I. Basic Green 4) | 0.03 |
| Leuco cyrstal violet | 0.4 |

| Hydroxylamine Compound (g) | Aging (days) at 40° C. | ΔA (Control) | ΔA (Sample) | % Inhibition |
|---|---|---|---|---|
| (13) N,N-diethyl- | | | | |
| 0.5 | 2 | 0.704 | 0.606 | 13.9 |
| (14) N,N-dibenzyl | | | | |

-continued

| Hydroxyl-amine Compound (g) | Aging (days) at 40° C. | ΔA (Control) | ΔA (Sample) | % Inhibition |
|---|---|---|---|---|
| 0.5 | 2 | 0.704 | 0.054 | 92.3 |
| (15) N-cyclohexyl-. HCl | | | | |
| 0.5 | 2 | 0.704 | 0.144 | 79.5 |

Examples 16 to 23

The composition of Examples 1 to 10 are utilized in these examples except that the benzophenone, Michler's ketone and biimidazole ingredients are replaced by the following initiator compounds in the amounts indicated.

| Examples | Initiator | Amount (g) |
|---|---|---|
| 16 | Benzoin methyl ether | 7.5 |
| 17 | 2,2-Dimethoxy-2-phenylacetophenone | 7.5 |
| 18–20 | Acetophenone | 6.0 |
| 21–23 | Ethylanthraquinone | 6.0 |

| Hydroxyl-amine Compound (g) | Aging (days) at 40° C. | ΔA (Control) | ΔA (Sample) | % Inhibition |
|---|---|---|---|---|
| (16) N,N-diethyl- 0.5 | 3 | 0.476 | 0.250 | 47.5 |
| (17) N,N-diethyl- 0.5 | 3 | 0.252 | 0.078 | 69.0 |
| (18) N,N-diethyl- 0.5 | 5 | 0.180 | 0.110 | 38.9 |
| (19) N,N-dibenzyl- 0.5 | 5 | 0.180 | 0.040 | 77.8 |
| (20) N-cyclohexyl-. HCl 0.5 | 5 | 0.180 | 0.100 | 44.4 |
| (21) N,N-diethyl- 0.5 | 5 | 0.310 | 0.300 | 3.23 |
| (22) N,N-dibenzyl- 0.5 | 5 | 0.310 | 0.300 | 3.22 |
| (23) N-cyclohexyl-. HCl 0.5 | 5 | 0.310 | 0.212 | 31.6 |

I claim:

1. A photosensitive composition comprising an admixture of
   (A) a photooxidant compound,
   (B) a leuco dye that is oxidizable to dye by the photooxidant, and
   (C) a hydroxylamine compound of the formula $R_1R_2NOH$, and acid salts thereof, wherein each of $R_1$ and $R_2$ can be hydrogen with the proviso that both cannot be hydrogen, a linear or branched-chain alkyl group of 2 to 14 carbon atoms, a cyclic alkyl group of 5 to 14 carbon atoms, an aryl group of 6 to 10 carbon atoms, an aralkyl group wherein the aryl moiety is of 6 to 10 carbon atoms and the alkyl moiety is of 1 to 14 carbon atoms, and an alkaryl group wherein the aryl moiety is of 6 to 10 carbon atoms and the alkyl moiety is of 1 to 9 carbon atoms, and $R_1$ and $R_2$ when taken together may with the nitrogen atom form a heterocyclic ring of 5 to 7 carbon atoms.

2. A photosensitive composition according to claim 1 wherein (D) at least one addition polymerizable ethylenically unsaturated monomeric compound is present in the admixture.

3. A photosensitive composition according to claim 1 or claim 2 wherein (E) at least one polymeric binder is present in the admixture.

4. A photosensitive composition according to claim 1 wherein an additional NOH group is attached to $R_1$ or $R_2$.

5. A photosensitive composition according to claim 1 wherein the photooxidant compound is a 2,4,5-triphenylimidazolyl dimer where the phenyl groups may be substituted.

6. A photosensitive composition according to claim 5 wherein the 2,4,5-triphenylimidazolyl dimer is 2,2'-bis-(o-chlorophenyl)-4,4,5,5'-tetraphenylbiimidazole.

7. A photosensitive composition according to claim 1 wherein the photooxidant compound is a ketone compound.

8. A photosensitive composition according to claim 7 wherein the ketone compound is Michler's ketone.

9. A photosensitive composition according to claim 2 wherein the monomeric compound is trimethylolpropane triacrylate, triethyleneglycoldimethacrylate or a combination of both compounds.

10. A photosensitive composition according to claim 3 wherein the polymeric binder is a combination of styrene/maleic anhydride copolymer and styrene/acrylic acid copolymer.

11. A photosensitive composition according to claim 1 wherein the hydroxylamine compound is of the formula $R_1R_2NOH$ wherein $R_1$ and $R_2$ are alkyls of 2 to 14 carbon atoms.

12. A photosensitive composition according to claim 11 wherein the hydroxylamine compound is N,N-diethylhydroxylamine.

13. A photosensitive composition according to claim 1 wherein the leuco dye has one to two removable hydrogens, the removal of which forms a differently colored compound, with the proviso that when the leuco form has only one removable hydrogen and the resultant dye is cationic, there is also present a mineral acid, organic acid or acid-supplying compound which forms a salt with the leuco form of the dye.

14. A photosensitive composition according to claim 13 wherein the leuco dye is the salt of an acid in leuco form of a triphenylmethane dye having, in at least two of the phenyl rings positioned para to the methane carbon atom, a substituent selected from the group consisting of amino, and $C_1$ to $C_4$ dialkyl amino groups, the acid being a mineral acid, an organic acid, or a acid-supplying compound.

15. A photosensitive element which comprises a support bearing a layer of a photosensitive composition according to claim 3.

16. A photosensitive element according to claim 15 wherein the support is a film support.

* * * * *